(12) United States Patent
Seki (10) Patent No.: US 9,873,955 B2
(45) Date of Patent: Jan. 23, 2018

(54) METHOD FOR PRODUCING SIC SINGLE CRYSTAL SUBSTRATE IN WHICH A CR SURFACE IMPURITY IS REMOVED USING HYDROCHLORIC ACID

(71) Applicant: TOYOTA JIDOSHA KABUSHIKI KAISHA, Toyota-shi, Aichi-ken (JP)

(72) Inventor: Akinori Seki, Suntoh-gun (JP)

(73) Assignee: TOYOTA JIDOSHA KABUSHIKI KAISHA, Tokyo (JP)

( * ) Notice: Subject to any disclaimer, the term of this patent is extended or adjusted under 35 U.S.C. 154(b) by 127 days.

(21) Appl. No.: 14/628,558

(22) Filed: Feb. 23, 2015

(65) Prior Publication Data

US 2015/0259829 A1 Sep. 17, 2015

(30) Foreign Application Priority Data

Mar. 11, 2014 (JP) .................................. 2014-047781

(51) Int. Cl.
| | |
|---|---|
| *C30B 19/12* | (2006.01) |
| *C30B 33/10* | (2006.01) |
| *C30B 9/06* | (2006.01) |
| *C30B 29/36* | (2006.01) |
| *C30B 9/10* | (2006.01) |
| *C30B 33/00* | (2006.01) |
| *C30B 23/02* | (2006.01) |

(52) U.S. Cl.
CPC ................. *C30B 33/10* (2013.01); *C30B 9/06* (2013.01); *C30B 9/10* (2013.01); *C30B 29/36* (2013.01); *C30B 33/00* (2013.01); *C30B 23/02* (2013.01)

(58) Field of Classification Search
CPC .... C30B 9/00; C30B 9/04; C30B 9/06; C30B 9/08; C30B 9/10; C30B 15/00; C30B 15/36; C30B 19/00; C30B 19/02; C30B 19/12; C30B 23/00; C30B 23/02; C30B 23/025; C30B 29/00; C30B 29/10; C30B 29/36; C30B 33/00; C30B 33/08; C30B 33/10
USPC ......... 117/11, 13, 35, 54, 58, 73, 78–79, 84, 117/88–90, 94, 106, 937, 951
See application file for complete search history.

(56) References Cited

U.S. PATENT DOCUMENTS 5,679,153 A * 10/1997 Dmitriev ................. C30B 19/04
117/106
6,419,757 B2 * 7/2002 Otsuki ..................... B08B 3/12
134/1

(Continued)

FOREIGN PATENT DOCUMENTS

| CN | 102471927 A | 5/2012 |
| JP | H104074 A | 1/1998 |

(Continued)

OTHER PUBLICATIONS

Bonner, et al. publication entitled "The boiling points of constant boiling hydrochloric acids," J. Am. Chem. Soc., vol. 52, pp. 1747-1750 (1930).*

*Primary Examiner* — Kenneth A Bratland, Jr.
(74) *Attorney, Agent, or Firm* — Oliff PLC (57) ABSTRACT

A method for producing a SiC single crystal substrate that can remove Cr impurity from the surface of a SiC single crystal that contains Cr as an impurity, is provided. This is achieved by a method for producing a SiC single crystal substrate, wherein the method includes a step of immersing a SiC single crystal substrate containing Cr as an impurity in hydrochloric acid at 50° C. to 80° C.

15 Claims, 4 Drawing Sheets

(56) References Cited

U.S. PATENT DOCUMENTS

| | | | |
|---|---|---|---|
| 2002/0005213 A1 | 1/2002 | Otsuki et al. | |
| 2002/0104477 A1* | 8/2002 | Yamoto | C23C 16/24 117/94 |
| 2003/0233977 A1 | 12/2003 | Narendar et al. | |
| 2005/0016959 A1 | 1/2005 | Tan et al. | |
| 2006/0234058 A1* | 10/2006 | Ohmi | C30B 29/36 428/409 |
| 2009/0095321 A1* | 4/2009 | Kim | H01L 21/02052 134/1.3 |
| 2011/0200833 A1* | 8/2011 | Kamei | C30B 9/10 428/446 |
| 2012/0183466 A1 | 7/2012 | Sasaki | |
| 2013/0042802 A1 | 2/2013 | Danno et al. | |
| 2013/0052774 A1 | 2/2013 | Kurobe | |
| 2013/0256700 A1 | 10/2013 | Ishibashi | |
| 2015/0191849 A1 | 7/2015 | Shirai et al. | |

FOREIGN PATENT DOCUMENTS

| | | |
|---|---|---|
| JP | 2000169233 A | 6/2000 |
| JP | 2005047753 A | 2/2005 |
| JP | 2009094509 A | 4/2009 |
| JP | 2010245260 A | 10/2010 |
| JP | 2011230941 A | 11/2011 |
| JP | 2013-184860 A | 9/2013 |
| JP | 2013-252979 A | 12/2013 |
| WO | 2010/024392 A1 | 3/2010 |
| WO | 2012002440 A1 | 1/2012 |
| WO | 2013/150822 A1 | 10/2013 |

* cited by examiner

METHOD FOR PRODUCING SIC SINGLE CRYSTAL SUBSTRATE IN WHICH A CR SURFACE IMPURITY IS REMOVED USING HYDROCHLORIC ACID

TECHNICAL FIELD

The present invention relates to a method for producing a SiC single crystal substrate.

BACKGROUND ART

SiCs (silicon carbides) are thermally and chemically very stable, superior in mechanical strengths, and resistant to radiation, and also have superior physical properties, such as high breakdown voltage and high thermal conductivity compared to Si crystals. They are therefore able to exhibit high output, high frequency, voltage resistance and environmental resistance that cannot be realized with existing single crystal substrate materials, such as Si crystals and GaAs crystals, and are being considered ever more promising as next-generation single crystal substrate materials for a wide range of applications including power device materials that allow high power control and energy saving to be achieved, device materials for high-speed large volume information communication, high-temperature device materials for vehicles, radiation-resistant device materials and the like.

The following production methods have been known in the prior art for fabrication of SiC single crystal substrates. First, a SiC ingot is obtained by crystal growth using a sublimation process or solution process. The SiC grown crystal is sliced from the SiC ingot by using a wire saw or the like, and then subjected to mirror polishing.

After cleaning the SiC single crystal substrate following mirror polishing, the SiC single crystal substrate is complete. The most important step in cleaning the SiC single crystal substrate is removal of the metal impurities on the crystal surface. When metal impurities remain on the crystal surface, they significantly affect the quality of the epitaxial film formed on the SiC single crystal substrate, potentially constituting a major hindrance to fabrication of an active component, such as a field-effect transistor on the substrate.

It is generally considered that properties near the theoretical value can be obtained if the metal atom content remaining on the surface of a SiC single crystal substrate is no greater than $1\times10^{11}$ atoms/cm$^2$, and immersing of SiC single crystal substrates in hydrochloric acid has been proposed as a method of removing the metal impurities on the surface of such SiC single crystal substrates (PTL 1).

CITATION LIST

Patent Literature

[PTL 1] Japanese Unexamined Patent Publication No. 2005-47753

DISCLOSURE OF THE INVENTION

Problems to be Solved by the Invention

However, in the conventional methods that include the method described in PTL 1, it has become clear that when the SiC single crystal substrate contains Cr as an impurity on the surface, the Cr impurity on the crystal surface cannot be thoroughly removed.

It is therefore an object of the present invention to provide a method for producing a SiC single crystal substrate that can remove Cr impurity from the surface of a SIC single crystal that contains Cr as an impurity.

Means for Solving the Problems

The present invention is a method for producing a SiC single crystal substrate, comprising a step of immersing a SiC single crystal containing Cr as an impurity in hydrochloric acid at 50° C. to 80° C.

Effect of the Invention

According to the invention it is possible to obtain a SiC single crystal substrate having Cr impurity removed, from the surface of the SiC single crystal that contains Cr as an impurity.

DESCRIPTION OF EMBODIMENTS

During growth of a SiC single crystal by a sublimation process or solution process, the impurities produced from the starting materials, the solvent or the parts of the crystal growth apparatus may be incorporated into the surface region of the grown crystal as. inclusions, or may adhere onto the grown crystal, becoming included in the surface of the grown crystal.

For example, when a solution process is used, and Cr is added to a starting material composed mainly of Si to form a solvent and crystal growth is carried out in the Si/Cr solvent to grow a SiC single crystal, the amount of Cr impurity contained in the grown crystal by inclusion may relatively increase, and Si impurity may be included in the same amount as Cr.

When using a SiC single crystal substrate containing Cr and Si as impurities on the surface, and using, for example, monosilane ($SiH_4$) and propane ($C_3H_8$) as source gases, with nitrogen ($N_2$) as the doping gas and hydrogen ($H_2$) as the carrier gas, to grow a SiC single crystal epitaxial film, Cr and Si impurities are discharged into the gas phase in the chemical vapor phase deposition (CVD) furnace that has been heated to high temperature (1500° C. to 1600° C.) for growth of the epitaxial film. As a result, the C/Si ratio in the gas phase in the CVD furnace may be reduced, and the amount of dopant nitrogen (N) incorporated into the SiC epitaxial film may vary, having a significant effect on the quality of the epitaxial film.

SiC single crystals have very low solubility in chemicals, and it is difficult to remove impurities on crystals surfaces by RCA cleaning and the like that are commonly carried out on Si substrates in the prior art. In particular, it has been newly discovered that when Cr and Si are present as impurities on the surface of a SiC single crystal, substantially none of the Cr can be removed by conventional cleaning, such as RCA cleaning, of the grown crystal, and the Si present at locations covered by the Cr cannot also be removed, such that the quality of the epitaxial film formed after cleaning is not stable.

Cr may adhere to the SiC single crystal substrate in the steps after crystal growth. For example, Cr which is produced from a wire saw used for slicing of the SiC single crystal substrate, or a polishing agent, abrasive pad or polishing apparatus used for polishing of the SiC single crystal substrate may adhere to the SiC single crystal substrate. Cr incorporated as an inclusion in the SiC crystal ingot, or Cr adhering to the SiC crystal, may fly out into the apparatus during slicing and polishing, becoming re-attached to the SiC crystal surface. It was found that if the amount of Cr that may thus adhere to the grown crystal surface in the steps after crystal growth is a trace, it can be removed by a conventional cleaning process involving slight etching of the outer surface, such as RCA cleaning, but if the amount of Cr adhering to the surface of the grown crystal is large, the removal will be inadequate.

The present inventor has conducted diligent research on these newly discovered problems, and has found that metal impurities including Cr on the surface of a SiC single crystal substrate can be dissolved and removed by immersing the SiC single crystal substrate in hydrochloric acid at 50° C. to 80° C.

The present invention relates to a method for producing a SiC single crystal substrate, comprising a step of immersing a SiC single crystal substrate containing Cr as an impurity in hydrochloric acid (an aqueous hydrochloric acid solution) at 50° C. to 80° C.

The lower limit for the temperature of the hydrochloric acid used in the method of the invention is 50° C. or higher. If the temperature of the hydrochloric acid is 50° C. or higher it will be possible to sufficiently dissolve Cr. The upper limit for the temperature of the hydrochloric acid is no higher than 80° C. While Cr can be dissolved even if the temperature of the hydrochloric acid is higher than 80° C., evaporation of hydrochloric acid will tend to proceed making the method impractical.

The lower limit for the temperature of the hydrochloric acid is preferably 55° C. or higher and more preferably 60° C. or higher, and the upper limit for the temperature of the hydrochloric acid is preferably less than 75° C. and more preferably less than 70° C. Since the boiling point of the hydrochloric acid and the concentration of the hydrochloric acid, described below, are related, the maximum temperature can be set according to the concentration of the hydrochloric acid.

The lower limit for the concentration of the hydrochloric acid is preferably 25% or greater, more preferably 27% or greater and even more preferably 29% or greater, and the upper limit for the concentration of the hydrochloric acid is preferably no greater than 37%, more preferably no greater than 35% and even more preferably no greater than 33%. If the hydrochloric acid has a concentration within the aforementioned range, removal of Cr will be more satisfactory and evaporation of hydrochloric acid can be further minimized.

After a SiC ingot has been grown by a solution process or sublimation process, the SiC grown crystal is sliced from the SiC ingot, the seed crystal is separated, and then the surface of the SiC grown crystal may be subjected to mirror polishing to obtain a SiC single crystal substrate. During polishing of the SiC grown crystal, the SiC grown crystal is fixed to the polishing jig with an adhesive and polishing is carried out.

Preferably, before the step of immersing the SiC single crystal substrate obtained by mirror polishing of the SiC grown crystal into hydrochloric acid, the SiC single crystal substrate is immersed into an organic material-dissolving solution. By immersing the SiC single crystal substrate into an organic material-dissolving solution for about 5 to 15 minutes, for example, it is possible to remove the organic materials adhering to the surface of the SiC single crystal substrate. The organic material-dissolving solution is preferably acetone, or a solution containing $NH_4OH$ and $H_2O_2$. More preferably, before the step of immersing the SiC single crystal substrate in hydrochloric acid, the SiC single crystal substrate is immersed in acetone and then immersed in a solution containing $NH_4OH$ and $H_2O_2$. The organic material adhering to the surface is primarily the adhesive component used to fix the SiC grown crystal to the jig during polishing of the SiC grown crystal.

The solution containing $NH_4OH$ and $H_2O_2$ is an alkaline solution with a pH of 10 to 12 at a temperature of 70° C. to 90° C., and for example, it has an $NH_4OH$:$H_2O_2$:water mixing ratio (volume ratio) of 1:1:4 to 0.5:1:4, or 1:1:5 to 0.5:1:5. The proportion of $NH_4OH$, $H_2O_2$ and water may be adjusted as appropriate.

Preferably, the SiC single crystal substrate is not subjected to a conventional acid cleaning step between the step of growing the SiC single crystal and the step of immersing the SiC single crystal substrate in hydrochloric acid. It has been found that when the SiC single crystal substrate is subjected to acid cleaning, Cr is difficult to remove even if the SiC single crystal substrate is immersed in high-temperature hydrochloric acid thereafter. While it is not our intention to be constrained by theory, it is believed that when acid cleaning is carried out by conventional RCA cleaning of a SiC single crystal substrate containing Cr impurity, for example, the Cr becomes oxidized forming a passive state, and becomes difficult to be dissolved. When this occurs, it becomes difficult to remove the Si metal present as impurity due to inclusion and the like, at the locations covered by Cr.

Conventional acid cleaning includes step SC-2 of RCA cleaning, i.e. immersing into a mixed aqueous solution of hydrochloric acid+hydrogen peroxide water, and immersing into an acidic solution, such as sulfuric acid, nitric acid, fluoronitric acid, aqua regalis or hydrochloric acid at less than 50° C.

Preferably, after the step of immersing the SiC single crystal substrate into hydrochloric acid, the SiC single crystal substrate is immersed into a Si-dissolving solution. This can remove the Si impurity adhering to the SiC single crystal substrate.

The Si-dissolving solution used may be a conventional solution that can dissolve Si, and preferably a solution containing hydrofluoric acid (HF) and nitric acid ($HNO_3$), or more preferably a solution containing hydrofluoric acid (HF) and nitric acid ($HNO_3$) with a hydrofluoric acid (HF):nitric acid ($HNO_3$) volume ratio of 1:1 to 1:1.5.

Preferably, after the step of immersing the SiC single crystal substrate in the Si-dissolving solution, the SiC single crystal substrate is subjected to acid cleaning. As mentioned above, acid cleaning includes step SC-2 of RCA cleaning, i.e. immersing into a mixed aqueous solution of hydrochloric acid+hydrogen peroxide water, and immersing into an acidic solution, such as sulfuric acid, nitric acid, fluoronitric acid, aqua regalis or hydrochloric acid at less than 50° C.

More preferably, after the step of immersing the SiC single crystal substrate in the Si-dissolving solution, the SiC single crystal substrate is subjected to RCA cleaning. RCA cleaning is a technique developed for cleaning of Si wafers by the RCA company. RCA cleaning is a cleaning technique that is a combination of SC-1 cleaning using ammonia water-hydrogen peroxide water for the purpose of particle removal, and SC-2 cleaning using hydrochloric acid-hydrogen peroxide water for the purpose of metal impurity removal.

The SiC single crystal substrate used for the invention is a SiC single crystal containing Cr as an impurity. Cr may be included by inclusion in the crystal surface region during the process of growth of the SiC single crystal, or it may adhere to the crystal surface during the steps after the growth step. For the purpose' of the present application, the term "Cr impurity" includes Cr incorporated into the surface region of the SiC crystal, Cr adhering to the surface of the SiC crystal, or a combination of both. The same applies for other impurities, such as Si.

The invention exhibits a particular effect for cleaning of SiC single crystal substrates with large amounts of Cr impurity. The invention may naturally be applied to SiC single crystal substrates containing only trace amounts of Cr. Thus, the amount of Cr impurity in a SiC single crystal that may be used for the invention is not particularly restricted, and for example, the amount of Cr impurity in the surface region of the SiC crystal may be $1\times10^{16}$ to $1\times10^{19}$ atoms/cm$^2$, and the amount of Cr impurity in the outermost surface including adhering impurities may be $1\times10^{16}$ to $1\times10^{21}$ atoms/cm$^2$.

The SiC single crystal substrate to be used for the invention may be a n-type SiC semiconductor with low resistivity, and for example, it may have a resistivity of up to 20 mΩ·cm. When the SiC single crystal substrate is a n-type SiC single crystal, it may have a nitrogen density of $1\times10^{18}$/cm$^3$ or greater, and the upper limit for the nitrogen density in the n-type SiC single crystal may be about $1\times10^{20}$/cm$^3$, due to the solubility limit of nitrogen in the SiC single crystal and for polytype stability. Such nitrogen may be introduced by any desired method, and for example, it may be introduced by incorporating a prescribed amount of nitrogen into the growth atmosphere.

The method of growing the SiC single crystal which may be used in the invention may be a method commonly employed in SiC single crystal growth methods, such as a solution process or gas phase process, and it is preferred to use a solution process, a sublimation process or a high-temperature CVD (chemical vapor deposition) process, and more preferably a solution process.

An example of a method of growing a SiC single crystal by a solution process will now be described, with the understanding that the growth method is not limited to the described method.

In a solution process, a SiC crystal may be grown by melting Si may in a graphite crucible, optionally adding Cr or the like to form a molten liquid, dissolving C in the molten liquid, and depositing a SiC crystal layer on a seed crystal substrate set in the low temperature section. Solution processes can be expected to reduce defects since crystal growth is carried out in a state of near thermal equilibrium, compared to gas phase processes.

Figure 1:
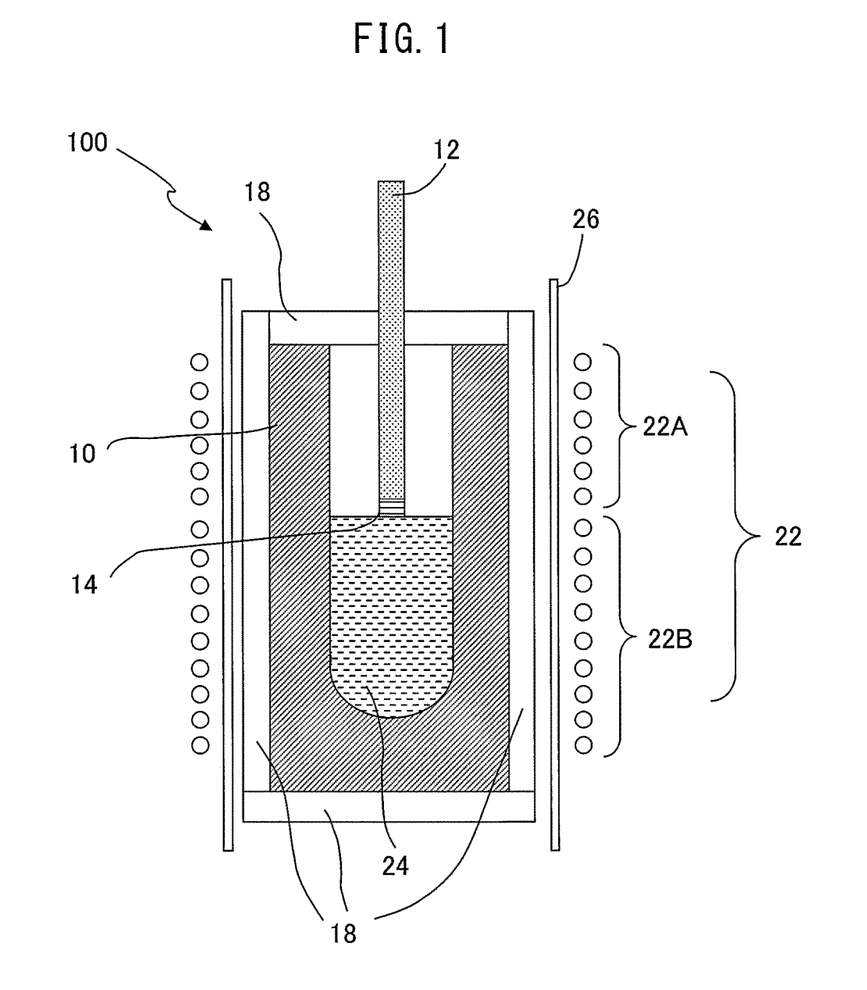
FIG. 1 is a cross-sectional schematic drawing showing an example of the constitution of a SiC crystal production apparatus employing a solution process.

FIG. 1 shows a cross-sectional schematic drawing of an example of a SiC crystal production apparatus that may be used in a solution process. The illustrated SiC crystal production apparatus 100 comprises a crucible 10, wherein the crucible 10 receives a Si—C solution 24 having C dissolved in a molten liquid of Si or Si/X, a temperature gradient is formed in which the temperature is decreased from the interior of the Si—C solution 24 toward the surface of the Si—C solution 24, and the seed crystal substrate 14 that is held at the tip of the vertically movable seed crystal holding shaft 12 is contacted with the Si—C solution 24 to allow growth of the SiC crystal from the seed crystal substrate 14.

The Si—C solution 24 is prepared by loading the starting materials into the crucible, melting them by heating to prepare Si or Si/X molten liquid, and dissolving C therein. X is not particularly restricted so long as it is one or more metals and can form a liquid phase (solution) that is in a state of thermodynamic equilibrium with SiC (solid phase). Suitable examples of X metals include Ti, Cr, and Ni. For example, Cr, Ni and the like may be loaded into the crucible in addition to Si, to form a Si—Cr solution, Si—Cr—Ni solution or the like.

If the crucible 10 is a carbonaceous crucible, such as a graphite crucible, or SiC crucible, C will dissolve into the molten liquid by dissolution of the crucible 10, thereby forming a Si—C solution. This will avoid the presence of undissolved C in the Si—C solution 24, and prevent waste of SiC by deposition of the SiC crystal onto the undissolved C. The supply of C may be performed by utilizing a method of, for example, blowing in hydrocarbon gas or loading a solid C source together with the molten liquid starting material, or these methods may be combined together with dissolution of the crucible.

The Si—C solution 24 preferably has a surface temperature of 1800° C. to 2200° C., which will minimize fluctuation in the amount of dissolution of C into the Si—C solution.

Temperature measurement of the Si—C solution can be carried out by using a thermocouple or radiation thermometer. From the viewpoint of high temperature measurement and preventing inclusion of impurities, the thermocouple is preferably a thermocouple comprising a tungsten-rhenium wire covered with zirconia or magnesia glass, placed inside a graphite protection tube.

The seed crystal holding shaft 12 is a graphite shaft that holds the seed crystal substrate on its end face, and there may be used a graphite shaft of any desired shape, such as cylindrical or columnar.

For thermal insulation, the outer periphery of the crucible 10 may be covered with a heat-insulating material 18. These may be housed together inside a quartz tube 26. A heating device is disposed around the heat-insulating material 18. The heating device may be, for example, a high-frequency coil 22. The high-frequency coil 22 may be configured with an upper level coil 22A and a lower level coil 22B. The upper level coil 22A and lower level coil 22B can be independently regulated.

Since temperatures of the heating device including the crucible 10, heat-insulating material 18 and high-frequency coil 22 become high, they may be situated inside a water-cooling chamber. The water-cooling chamber may be provided with a gas inlet and a gas exhaust vent to allow atmospheric modification in the apparatus.

The temperature of the Si—C solution 24 generally has a temperature distribution in which the temperature of the surface of the Si—C solution 24 is lower than the interior due to radiation and the like. Also, when the heating device is a high-frequency coil 22 comprising an upper level coil 22A and a lower level coil 22B, the outputs of the upper level coil 22A and lower level coil 22B may be separately adjusted to form a prescribed temperature gradient in the Si—C solution 24 in which the temperature is decreased from the interior of the Si—C solution 24 toward the surface region. The temperature gradient may be 10 to 50° C./cm, in a range to about 1 cm from the solution surface, for example.

The C that has dissolved in the Si—C solution 24 is dispersed by diffusion and convection. In the vicinity of the bottom face of the seed crystal substrate 14, a temperature gradient can be formed so that it is at lower temperature than the interior of the Si—C solution 24, by utilizing the power control of the heating device, heat radiation from the surface of the Si—C solution 24, and heat loss through the seed crystal holding shaft 12. When the C that has dissolved into the solution interior that is at high temperature and has high solubility reaches the region near the seed crystal substrate that is at low temperature and has low solubility, a supersaturation state appears and a SiC single crystal is grown on the seed crystal substrate by virtue of supersaturation as a driving force.

An example of a growth method utilizing a sublimation process will now be described, with the understanding that the growth method is not limited to the described method. Since a sublimation process has a high crystal growth rate, most SiC bulk single crystals have been produced by sublimation processes in the prior art.

A crystal growth step of a SiC crystal utilizing a sublimation process will now be described. For production of a SIC crystal by a sublimation process, SiC powder as the starting material is packed into a crucible in which a seed crystal substrate is set, and then the crucible is set inside a crystal growth apparatus. The interior of the crystal growth apparatus is then filled with an inert gas atmosphere, and the pressure is reduced. The crystal growth apparatus is then heated to 1800° C. to 2400° C. This allows the SiC powder inside the crucible to be dissolved and sublimated to generate sublimated chemical species (gas), which reach the crystal growth plane of the seed crystal held in the crystal growth temperature range and can cause epitaxial growth of the SiC crystal.

Figure 2:
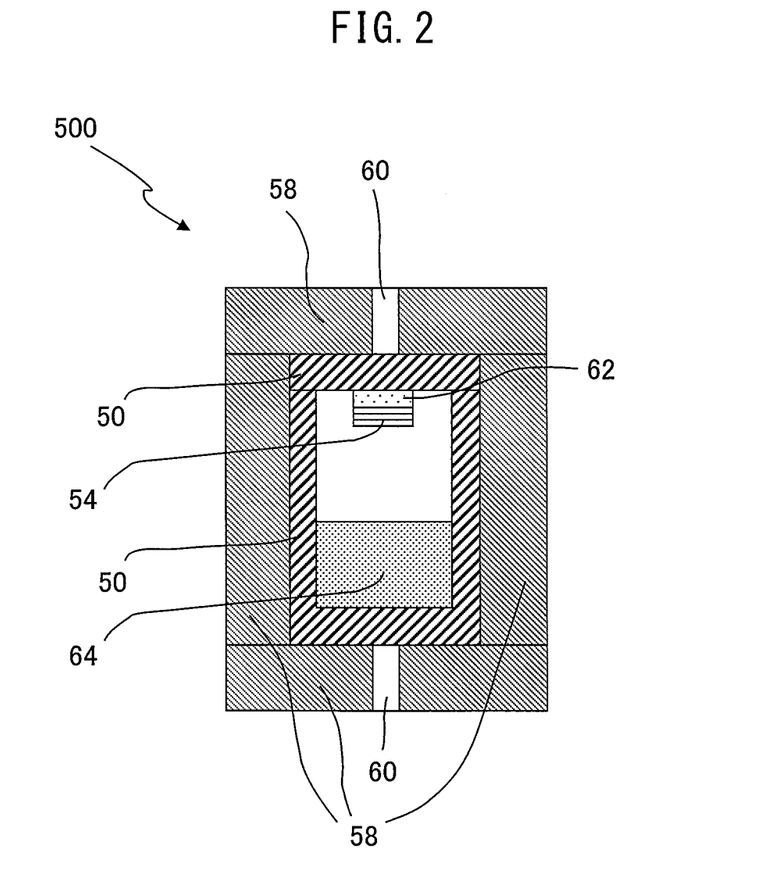
FIG. 2 is a cross-sectional schematic drawing showing an example of the constitution of a SiC crystal production apparatus employing a sublimation process.

FIG. 2 is a cross-sectional schematic drawing of an example of a SiC crystal production apparatus that may be used in a sublimation process. As shown in FIG. 2, the crystal growth apparatus 500 comprises a crucible 50 filled with a SiC starting powder 64 in a sufficient amount for crystal growth of a SiC crystal, and a heat-insulating material 58 situated on the sides and above and below the crucible 50, and it is placed in a vacuum container with a gas inlet and a gas outlet allowing evacuation with an evacuation device and pressure control of the internal atmosphere with an inert gas, such as Ar.

The material of the crucible 50 may be, for example, a carbon material, such as graphite. The vacuum container can be formed of a material that retains a high vacuum, such as quartz or stainless steel. The material of the heat-insulating material 58 may be, for example, A carbon material, such as carbon fibers.

A portion of the top of the crucible 50 protrudes in a cylindrical form, forming a stage 62 for mounting of the SiC seed crystal substrate 54, where the seed crystal substrate 54 is held. Holding the seed crystal substrate 54 onto the mounting stage 62 may be performed by bonding using a graphite adhesive, for example.

A heating device is situated on the exterior of the vacuum container, and heating may be performed, for example, with a high-frequency coil wrapped around the periphery of the vacuum container.

The crucible temperature can be measured, for example, by providing an optical path 60 with a diameter of 2 to 4 mm at the center section of the heat-insulating material 58 covering the bottom of the crucible, to extract light from below the crucible, and performing measurement with a radiation thermometer. This temperature may be considered the temperature of the starting material. An optical path 60 may be similarly provided at the center of the heat-insulating material 58 covering the top of the crucible, allowing measurement of the temperature of the crucible 50 in the same manner. This temperature may be considered the temperature of the seed crystal.

The seed crystal substrate 54 may be held on a mounting stage 62, for crystal growth in the following manner, for example.

The atmosphere in the vacuum container is substituted with an inert gas, such as high-purity argon gas. The vacuum container and the crucible 50 situated inside it are then heated with a heating device, such as a high-frequency heating coil disposed surrounding the vacuum container. The heating device is not limited to a high-frequency heating coil, and may instead be a resistance heating system.

The position of the heating device, such as a high-frequency heating coil, is adjusted so that the top of the crucible 50 is the low temperature section and the bottom of the crucible 50 is the high temperature section. This efficiently generates sublimation gas from the SiC powder 64 at the bottom of the crucible 50, and cools the sublimation gas at the top of the crucible 50, thereby allowing crystal growth of a SiC crystal from the seed crystal substrate 54.

Preferably, growth is initiated with the starting material temperature set to 2100° C. to 2500° C. and more preferably 2200° C. to 2400° C., in order to facilitate gasification of the starting materials and to facilitate growth of a high quality crystal. The seed crystal temperature is preferably 40° C. to 100° C. and more preferably 50° C. to 70° C. lower than the starting material temperature, and the temperature gradient is preferably 5 to 25° C./cm and more preferably 10 to 20° C./cm.

Next, with the crucible 50 at the preset temperature, the inert gas is evacuated through a gas outlet to create a reduced pressure state inside the vacuum container of about 133.3 to 13332.2 Pa, thereby producing crystal growth of the SiC crystal on the seed crystal 54. By performing crystal growth for a fixed time period, it is possible to produce crystal growth of a SiC crystal having a prescribed size.

Crystal growth of a SiC crystal can also be performed by a high temperature CVD process similar to the prior art.

EXAMPLES (Evaluation of Cr Solubility)

A bulk sample of 1.2 g of pure Cr metal (product of Kojundo Chemical Laboratory Co., Ltd., 99.99%) was immersed for 5 minutes in different chemicals, and the weight was measured before and after immersing the bulk sample to evaluate the solubility of the pure Cr metal in each chemical. A reduction in weight of no greater than 1% by immersing was judged to be insoluble, and a reduction in weight of 42% or greater after immersing was judged to be soluble. There were no results with a weight reduction of between 1% and 42%. The evaluation results are shown in Table 1. Chemicals found to be Cr-dissolving, and some chemicals not found to be Cr-dissolving, were evaluated by external microscopic observation for their solubility of organic adhesion as well.

TABLE 1

Results for pure Cr solubility

| Chemical | Cr solubility | Organic adhesion solubility |
|---|---|---|
| Aqua regalis (room temperature) | Insoluble | Not evaluated |
| Dilute HCl (1 mol %) (room temperature) | Insoluble | Not evaluated |
| Fluoronitric acid (HF:$HNO_3$) = 1:1 (room temperature) | Insoluble | Insoluble |
| Mixed chromate etching solution* (room temperature) (Kanto Kagaku) | Insoluble | Not evaluated |
| HCl (35%) (room temperature) | Insoluble | Insoluble |
| HCl (35%) 50° C. | Soluble 57% weight reduction | Insoluble |
| HCl (35%) 60° C. | Soluble 42% weight reduction | Insoluble |
| HCl (35%) 80° C. | Soluble 100% weight reduction | Soluble |
| $NH_4OH$ + $H_2O_2$ + water (1:1:4) 80° C. | Insoluble | Soluble |
| Sulfuric acid (97%) + $H_2O_2$ (4:1) 80° C. → HCl (35%) 60° C. | Insoluble | Not evaluated |
| HCl (35%) + $H_2O_2$ + water (1:1:6) 80° C. | Insoluble | Not evaluated |

*Mixed chromate etching solution: solution containing cerium(II) ammonium nitrate, perchloric acid and water.

The solubilities of different chemicals for pure Cr metal were examined, and it was found that high-temperature hydrochloric acid at 50° C. or higher (35% HCl aqueous solution) had superior solubility for pure Cr metal. Cr was practically insoluble in the other chemicals. For example, dissolution of Cr substantially failed to proceed when immersing in sulfuric acid (97%)+$H_2O_2$ (4:1) at 80° C. before immersing in a high temperature hydrochloric acid aqueous solution, and then immersing in 60° C. high-temperature hydrochloric acid (35% HCl aqueous solution).

Example 1

A SiC single crystal was grown by a solution process, in the following manner.

There was prepared a SiC single crystal formed by a sublimation process, which was a discoid 4H-SiC single crystal with a diameter of 12 mm, a thickness of 700 μm, and the bottom face as the (000-1) face, for use as a seed crystal substrate. The top face of the seed crystal substrate was bonded to roughly the center section of the end face of a cylindrical graphite shaft, using a graphite adhesive.

A single crystal production apparatus as shown in FIG. 1 was used, and Si/Cr were loaded as molten liquid materials for formation of a Si—C solution, at an atomic composition percentage of 60:40, into a graphite crucible holding a Si—C solution.

After vacuum suction of the interior of the single crystal production apparatus to $1 \times 10^{-3}$ Pa, argon gas was introduced to 1 atmosphere and the air inside the single crystal production apparatus was exchanged with argon. The high-frequency coil was electrified to melt the starting material in the graphite crucible by heating, thereby forming a Si/Cr alloy molten liquid. Then, a sufficient amount of C was dissolved into the Si/Cr alloy molten liquid from the graphite crucible to form a Si—C solution.

The outputs of the upper level coil and lower level coil were adjusted to heat the graphite crucible, increase the temperature on the surface of the Si—C solution to 2000° C., and create an average temperature gradient of 30° C./cm, in which the temperature was decreased from the solution interior in a range of 1 cm from the solution surface, toward the solution surface. Temperature measurement of the surface of the Si—C solution was performed with a radiation thermometer, and measurement of the temperature gradient of the Si—C solution was performed by using a vertically movable thermocouple.

Seed touching was performed, in which the position of the bottom face of the seed crystal substrate was placed at a position matching the liquid surface of the Si—C solution, and the bottom face of the seed crystal substrate was contacted with the Si—C solution, while keeping the bottom face of the seed crystal substrate bonded to the graphite shaft parallel to the Si—C solution surface. The graphite shaft was then raised 1.5 mm to prevent the Si—C solution from wetting up and contacting the graphite shaft, and was held at that position for 10 hours for growth of a SiC single crystal.

Upon completion of the crystal growth, the graphite shaft was raised and the seed crystal substrate and the SiC single crystal grown from the seed crystal substrate were severed from the Si—C solution and the graphite shaft and were recovered. The grown SiC single crystal had a diameter of 12 mm and a thickness of 1.5 mm.

The obtained SiC single crystal was sliced into a sheet and separated from the seed crystal substrate, and the sliced SiC single crystal was anchored to a polishing jig by using an adhesive and subjected to mirror polishing of the (0001) face of the SiC single crystal, and then subjected to flowing water cleaning with ultrapure water.

The mirror polished SiC single crystal substrate was immersed for 5 minutes in acetone and subjected to ultrasonic cleaning, to clean the organic adhesion (organic cleaning) and remove the organic materials, such as adhesive components used for anchoring during polishing.

The SiC single crystal substrate was then immersed for 5 minutes in hydrochloric acid (35% HCl aqueous solution) heated to 60° C., and the Cr impurity present on the surface of the SiC single crystal substrate was removed. After immersing, the SiC single crystal substrate was immersed in ultrapure water and then subjected to flowing water cleaning with ultrapure water.

The SiC single crystal substrate was immersed for 5 minutes in a 25° C. fluoronitric acid (HF:$HNO_3$=1:1) solution to remove the residually adhering Si component. After immersing, the SiC single crystal substrate was immersed in ultrapure water and then subjected to flowing water cleaning with ultrapure water.

Figure 3:
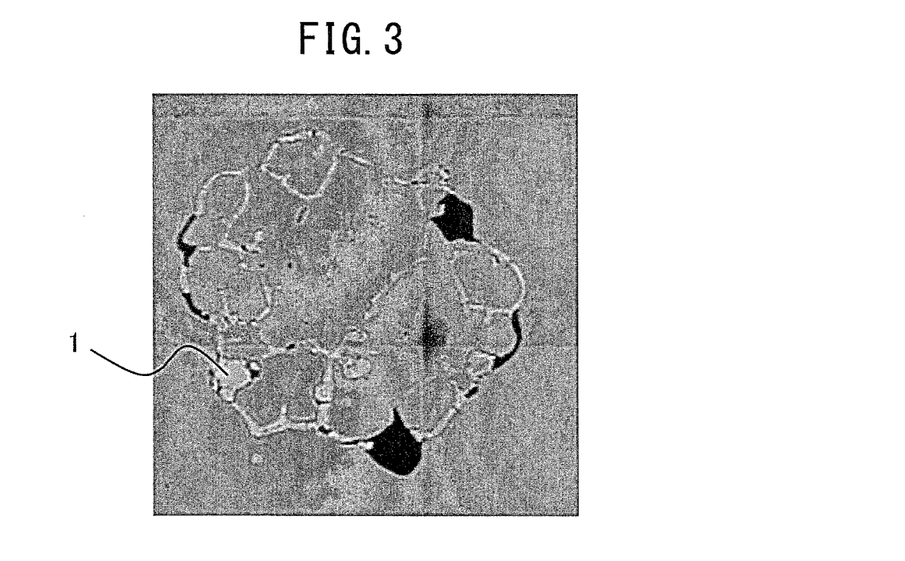
FIG. 3 is an optical microscope photograph of a SiC single crystal after organic cleaning (before hydrochloric acid cleaning).
Figure 4:
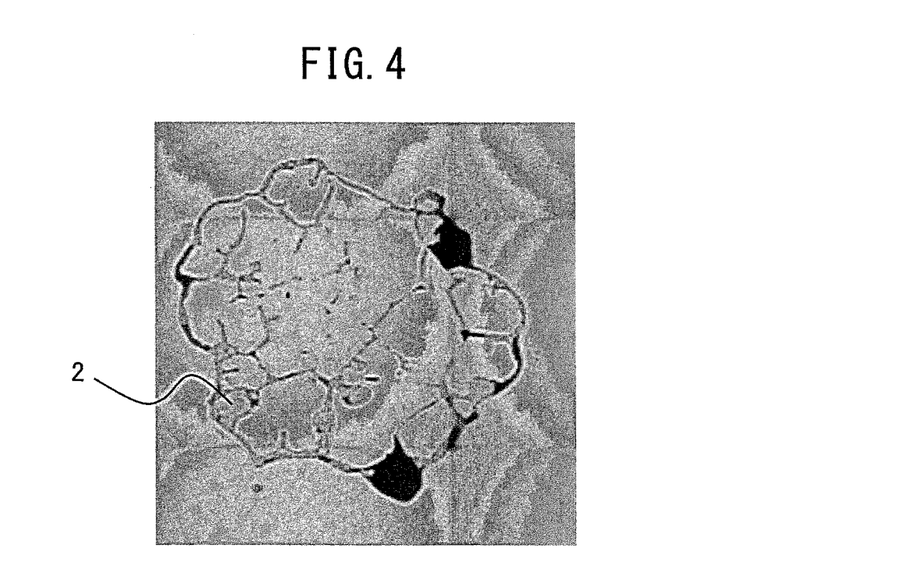
FIG. 4 is an optical microscope photograph of a SiC single crystal after immersing in a fluoronitric acid solution and cleaning with ultrapure water (after hydrochloric acid cleaning).

An optical microscope photograph of the organic-cleaned SiC single crystal substrate (before hydrochloric acid cleaning) is shown in FIG. 3, and an optical microscope photograph of the SiC single crystal substrate that was immersed in the fluoronitric acid solution and cleaned with ultrapure water (after hydrochloric acid cleaning) is shown in FIG. 4. The SiC single crystal substrate before hydrochloric acid cleaning was seen to have Cr-containing metal-adhering portions 1 as metallic luster (white sections), while no metallic luster (white sections) was seen on the hydrochloric acid-cleaned SiC single crystal substrate although large amounts of Cr were adhering to the grown crystal, and vestiges 2 of the removed Cr-containing metal were observed. The removal vestiges 2 of the Cr-containing metal reveal the underlying SiC single crystal.

Example 2

A SiC single crystal ingot grown by a solution process in the same manner as Example 1 was sliced into a sheet and separated from the seed crystal substrate, and the sliced SiC single crystal was anchored to a polishing jig by using an adhesive and subjected to mirror polishing of the (0001) face of the SiC single crystal, and then subjected to flowing water cleaning with ultrapure water.

The mirror polished SiC single crystal substrate was immersed for 5 minutes in acetone and subjected to ultrasonic cleaning, to clean the organic adhesion and remove the organic materials such as adhesive components used for anchoring during polishing.

The SiC single crystal substrate was then immersed for 5 minutes in a liquid mixture comprising $NH_4OH$ and $H_2O_2$ (ammonia water:hydrogen peroxide water:water=1:1:4), heated to 80° C. After immersing, the SiC single crystal substrate was immersed in ultrapure water and then subjected to flowing water cleaning with ultrapure water.

The SiC single crystal substrate was then immersed for 5 minutes in hydrochloric acid heated to 60° C. (35% HCl aqueous solution), and the Cr impurity present on the surface of the SiC single crystal was removed. After immersing, the SiC single crystal substrate was immersed in ultrapure water and then subjected to flowing water cleaning with ultrapure water.

The SiC single crystal substrate was immersed in a 25° C. fluoronitric acid ($HF:HNO_3$=1:1) solution to remove the residually adhering Si component. After immersing, the SiC single crystal substrate was immersed in ultrapure water and then subjected to flowing water cleaning with ultrapure water.

In the same manner as Example 1, a SiC single crystal that had been immersed in a liquid mixture of $NH_4OH$ and $H_2O_2$ and cleaned with ultrapure water (before hydrochloric acid cleaning) and a SiC single crystal that had been immersed in a fluoronitric acid solution and cleaned with ultrapure water (after hydrochloric acid cleaning) were observed under an optical microscope. On the SiC single crystal substrate before hydrochloric acid cleaning there were seen Cr-containing metal-adhering portions as metallic luster (white sections), with large amounts of Cr adhering to the grown crystal. On the SiC single crystal substrate after hydrochloric acid cleaning, no metallic luster (white sections) was seen, the Cr-containing metal was removed, and the underlying SiC single crystal was visible.

Figure 5:
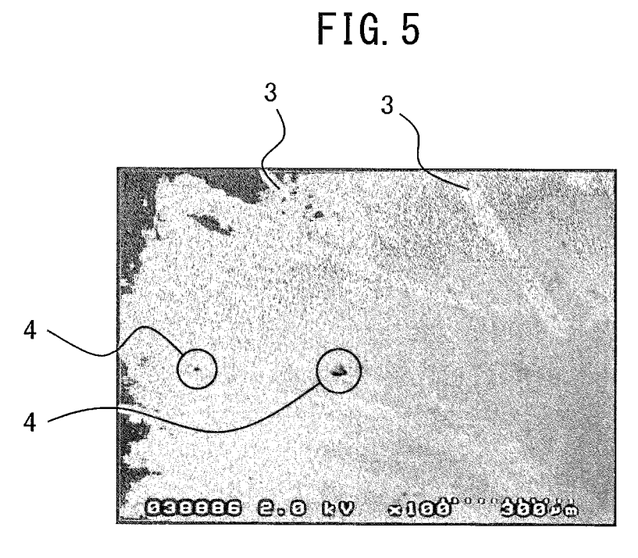
FIG. 5 is an electron micrograph of a SiC single crystal after immersing in a liquid mixture of $NH_4OH$ and $H_2O_2$ and cleaned with ultrapure water (before hydrochloric acid cleaning).
Figure 6:
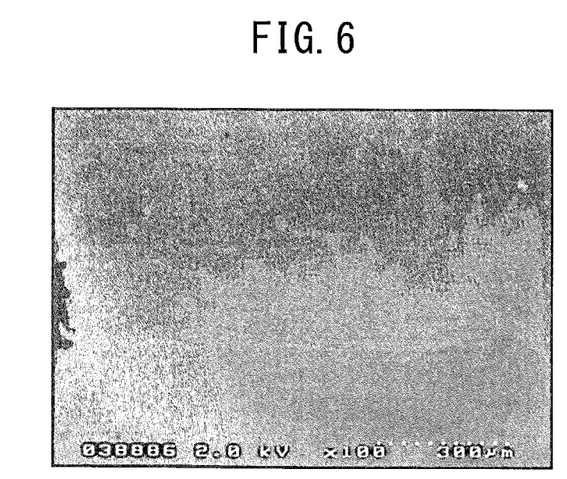
FIG. 6 is an electron microscope photograph of a SiC single crystal after immersing in a fluoronitric acid solution and cleaning with ultrapure water (after hydrochloric acid cleaning).

Also, a SiC single crystal after immersing in the liquid mixture of $NH_4OH$ and $H_2O_2$ and cleaning with ultrapure water (before hydrochloric acid cleaning), and a SiC single crystal after immersing in a fluoronitric acid solution and cleaning with ultrapure water (after hydrochloric acid cleaning), were observed with an electron microscope (differential interference microscope). An electron micrograph of the SiC single crystal after immersing in the liquid mixture of $NH_4OH$ and $H_2O_2$ and cleaning with ultrapure water (before hydrochloric acid cleaning), is shown in FIG. 5, and an electron micrograph of the SiC single crystal after immersing in a fluoronitric acid solution and cleaning with ultrapure water (after hydrochloric acid cleaning) is shown in FIG. 6. It was confirmed that, as shown in FIG. 5, the SiC single crystal after immersing in the liquid mixture of $NH_4OH$ and $H_2O_2$ and cleaning with ultrapure water (before hydrochloric acid cleaning) had a contrast pattern 3 due to organic adhesion and black spots 4 at the circled sections, while as shown in FIG. 6, the SiC single crystal after immersing in the fluoronitric acid solution and cleaning with ultrapure water (after hydrochloric acid cleaning) exhibited no organic adhesion, and it had therefore been removed.

EXPLANATION OF SYMBOLS

1 Cr-containing metal-adhering portion
2 Cr-containing metal-removal vestige
3 Contrast pattern due to organic adhesion
4 Black spot due to organic adhesion
100 Crystal production apparatus used in solution process
10 Crucible
12 Seed crystal holding shaft
14 Seed crystal substrate
18 Heat-insulating material
22 High-frequency coil
22A Upper level high-frequency coil
22B Lower level high-frequency coil
24 Si—C solution
26 Quartz tube
500 Crystal production apparatus used in sublimation process
50 Crucible
54 Seed crystal
58 Heat-insulating material
60 Optical path
62 Seed crystal mounting stage
64 SiC starting powder

What is claimed is:

1. A method for producing a SiC single crystal substrate, wherein the method comprises steps of:
   growing a SiC single crystal substrate containing Cr and Si as impurities by using a solution process or sublimation process;
   immersing the SiC single crystal substrate containing Cr and Si as impurities in a composition consisting essentially of hydrochloric acid at 50° C. to 80° C.; and
   immersing the SiC single crystal substrate in a Si-dissolving solution after the step of immersing in said composition,
   wherein the amount of Cr impurity on the SiC single crystal substrate in a surface region thereof is from $1\times10^{16}$ to $1\times10^{19}$ atoms/cm$^2$, and
   wherein the Si-dissolving solution is a solution containing hydrofluoric acid and nitric acid.

2. The method according to claim 1, wherein the method comprises a step of immersing the SiC single crystal substrate in an organic material-dissolving solution before the step of immersing in said composition.

3. The method according to claim 2, wherein the organic material-dissolving solution is acetone or a solution containing $NH_4OH$ and $H_2O_2$.

4. The method according to claim 1, wherein the method comprises a step of RCA cleaning of the SiC single crystal substrate after the step of immersing the SiC single crystal substrate in the Si-dissolving solution.

5. The method according to claim 1, wherein the step of growing the SiC single crystal substrate containing Cr and Si as impurities is before the step of immersing in said composition, and
   wherein the SiC single crystal substrate is not subjected to acid cleaning between the step of growing the SiC single crystal substrate and the step of immersing in said composition, wherein the acid cleaning includes immersing the SiC single crystal substrate into a mixed aqueous solution of hydrochloric acid and hydrogen peroxide water, sulfuric acid, nitric acid, fluoronitric acid, aqua regalis, or hydrochloric acid at less than 50° C.

6. The method according to claim 5, wherein the method comprises a step of polishing the SiC single crystal substrate after the step of growing the SiC single crystal substrate.

7. The method according to claim 5, wherein the acid cleaning is immersing the SiC single crystal substrate into a mixed aqueous solution of hydrochloric acid and hydrogen peroxide water.

8. The method according to claim 1, wherein the step of immersing in said composition is carried out at 55° C. to 75° C.

9. The method according to claim 1, wherein the step of immersing in said composition is carried out at 60° C. to 70° C.

10. The method according to claim 1, wherein said composition is an aqueous solution having a hydrochloric acid concentration of from 25 to 37%.

11. The method according to claim 10, wherein the hydrochloric acid concentration is from 27 to 35%.

12. The method according to claim 10, wherein the hydrochloric acid concentration is from 29 to 33%.

13. The method according to claim 1, wherein the amount of Cr impurity in an outermost surface thereof including adhering impurities is from $1 \times 10^{16}$ to $1 \times 10^{21}$ atoms/cm$^2$.

14. The method according to claim 5, wherein the step of growing the SiC single crystal substrate is carried out by a solution process using a Si/Cr solvent.

15. The method according to claim 1, wherein the composition consisting essentially of hydrochloric acid is a solution consisting of hydrochloric acid.

* * * * *